(12) United States Patent
Yao et al.

(10) Patent No.: US 8,143,608 B2
(45) Date of Patent: Mar. 27, 2012

(54) PACKAGE-ON-PACKAGE (POP) OPTICAL PROXIMITY SENSOR

(75) Inventors: Yufeng Yao, Singapore (SG); Chi Boon Ong, Singapore (SG)

(73) Assignee: Avago Technologies ECBU IP (Singapore) Pte. Ltd., Singapore (SG)

(*) Notice: Subject to any disclaimer, the term of this patent is extended or adjusted under 35 U.S.C. 154(b) by 307 days.

(21) Appl. No.: 12/557,516

(22) Filed: Sep. 10, 2009

(65) Prior Publication Data

US 2011/0057129 A1    Mar. 10, 2011

(51) Int. Cl.
*H01J 40/14*    (2006.01)
*H01L 31/09*    (2006.01)

(52) U.S. Cl. ............ 250/551; 250/239; 250/338.1; 257/433; 257/678; 438/25

(58) Field of Classification Search ............ 250/551, 250/239, 214 AL, 221, 338.1; 257/81, 433–435, 257/678, 686, 687, E33.058; 438/25, 26; 356/220
See application file for complete search history.

(56) References Cited

U.S. PATENT DOCUMENTS

| | | | |
|---|---|---|---|
| 5,155,777 | A | 10/1992 | Angelopoulos et al. |
| 5,367,393 | A | 11/1994 | Ohara et al. |
| 5,675,143 | A | 10/1997 | Heimlicher |
| 6,064,062 | A | 5/2000 | Bohn |
| 6,135,816 | A | 10/2000 | Mashiyama et al. |
| 6,364,706 | B1 | 4/2002 | Ando et al. |
| 6,572,410 | B1 | 6/2003 | Volstorf et al. |
| 6,635,955 | B2 | 10/2003 | Scheidle |
| 6,674,653 | B1 | 1/2004 | Valentine |
| 6,885,300 | B1 | 4/2005 | Johnston et al. |
| 7,026,710 | B2 | 4/2006 | Coyle et al. |
| 7,109,465 | B2 | 9/2006 | Kok et al. |
| 7,172,126 | B2 | 2/2007 | Schmidt et al. |
| 7,229,295 | B2 | 6/2007 | Ice et al. |
| 7,256,483 | B2 | 8/2007 | Epler et al. |
| 7,258,264 | B2 | 8/2007 | Ice et al. |
| 7,277,012 | B2 | 10/2007 | Johnston et al. |
| 7,289,142 | B2 | 10/2007 | Silverbrook |
| 7,387,033 | B2 | 6/2008 | Qing et al. |
| 7,387,907 | B2 | 6/2008 | Hsu et al. |
| 7,427,806 | B2 | 9/2008 | Arndt et al. |
| 7,510,888 | B2 | 3/2009 | Guenther et al. |

(Continued)

FOREIGN PATENT DOCUMENTS

EP    1455564    9/2004

(Continued)

OTHER PUBLICATIONS

Penchem Technologies Data Sheet for PENCHEM OP 580—IR Filter Optoelectronic Epoxy, Apr. 2009.

(Continued)

*Primary Examiner* — Kevin Pyo

(57) ABSTRACT

Various embodiments of a package-on-package optical sensor comprising three distinct different packages are disclosed. The three different packages are combined to form the optical proximity sensor, where the first package is a light emitter package, the second package is a light detector package, and the third package is an integrated circuit package. First and second infrared light pass components are molded or casted atop the light emitter package and the light detector package after they have been mounted atop the integrated circuit package. An infrared light cut component is then molded or casted between and over portions of the light emitter package and the light detector package.

22 Claims, 9 Drawing Sheets

U.S. PATENT DOCUMENTS

| | | | |
|---|---|---|---|
| 7,514,666 | B2 | 4/2009 | Yee et al. |
| 7,582,513 | B2 | 9/2009 | Kroeninger et al. |
| 7,675,132 | B2 | 3/2010 | Waitl et al. |
| 7,767,485 | B2 | 8/2010 | Ogawa et al. |
| 2002/0172472 | A1 | 11/2002 | Nelson et al. |
| 2004/0065894 | A1 | 4/2004 | Hashimoto et al. |
| 2005/0110157 | A1 | 5/2005 | Sherrer et al. |
| 2006/0016994 | A1 | 1/2006 | Basoor et al. |
| 2006/0022212 | A1 | 2/2006 | Waitl et al. |
| 2007/0045524 | A1 | 3/2007 | Rains |
| 2007/0072321 | A1 | 3/2007 | Sherrer et al. |
| 2008/0006762 | A1 | 1/2008 | Fadell et al. |
| 2008/0011939 | A1 | 1/2008 | Yee |
| 2008/0011940 | A1* | 1/2008 | Zhang et al. ............ 250/214 AL |
| 2008/0012033 | A1 | 1/2008 | Arndt |
| 2008/0049210 | A1 | 2/2008 | Takaoka |
| 2008/0116379 | A1 | 5/2008 | Teder |
| 2008/0118241 | A1 | 5/2008 | TeKolste et al. |
| 2008/0173963 | A1 | 7/2008 | Hsu et al. |
| 2008/0197376 | A1 | 8/2008 | Bert et al. |
| 2008/0265266 | A1 | 10/2008 | Bogner et al. |
| 2008/0296478 | A1 | 12/2008 | Hernoult |
| 2008/0308738 | A1 | 12/2008 | Li et al. |
| 2008/0308917 | A1 | 12/2008 | Pressel et al. |
| 2009/0027652 | A1 | 1/2009 | Chang et al. |
| 2009/0129783 | A1 | 5/2009 | Ori et al. |
| 2009/0159900 | A1 | 6/2009 | Basoor et al. |
| 2009/0267173 | A1 | 10/2009 | Takahashi et al. |
| 2010/0030039 | A1 | 2/2010 | Lamego et al. |
| 2010/0246771 | A1 | 9/2010 | Hawver et al. |
| 2010/0282951 | A1 | 11/2010 | Costello et al. |
| 2010/0327164 | A1 | 12/2010 | Costello et al. |
| 2011/0057104 | A1* | 3/2011 | Yao et al. .................. 250/338.1 |

FOREIGN PATENT DOCUMENTS

| WO | WO-2009/072786 | 6/2009 |
|---|---|---|

OTHER PUBLICATIONS

Penchem Technotogies Data Sheet for PENCHEM OP 579—IR Pass Optoelectronic Epoxy, Apr. 2009.

Technical Data Sheet, Nitto Denko Corporation, NT-MB-IRL3801, 2008.

Technical Data Sheet, Nitto Denko Corporation, NT-8506, 2001.

Avago Technologies APDS-9120 Integrated Optical Proximity Sensors Prelim Datasheet, Feb. 25, 2009.

Avago Technologies APDS-9800 Integrated Ambient Light and Proximity Sensor Prelim Datasheet, Mar. 2, 2009.

Avago Technologies APDS-9700 Signal Conditioning IC for Optical Proximity Sensors, Jan. 4, 2008.

Avago Technologies APDS-9005 Miniature Surface-Mount Ambient Light Photo Sensor, Jan. 164, 2007.

Data Sheet for TYTEK AIGaAs/GaAs infrared Chip—TK116IRA, Nov. 2006.

"A Dual Face Package Using a Post with Wire Components: Novel Structure for PoP, Wafer Level CSP and Compact Image Sensor Package," Ishihara et al., 2008 Electronic Components and Technology Conference, 1093-1098.

AZ Optics, "Device Debuts as the World's Best-Performing Integrated Light/Proximity Sensor", Nov. 11, 2008.

Khamal, Ibrahim, "Infra-Red Proximity Sensor (II)", Apr. 4, 2008.

"Agilent HSDL-D100 Miniature Surface-Mount Proximity Sensor Data Sheet", Dec. 21, 2007.

Avago Technologies, "APDS-9101—Integrated Reflective Sensor", Data Sheet 2007.

Avago Technologies, "HSDL-9100—Surface-Mount Proximity Sensor", Data Sheet 2006.

Costello, et al., "U.S. Appl. No. 12/495,739", Optical Proximity Sensor Package with Molded Infrared Light Rejection Barrier and Infrared Pass Components, filed Jun. 30, 2009.

IDES—The Plastic Web, , "Si Photo Diode Chip", Dec. 19, 2007.

Losee, et al., "A 1/3 Format Image Sensor with Refractory Metal Light Shield for Color Video Applications", Solid State Circuits Conference, Digest of Technical Papers, 36th ISSCC, IEEE International vol. Feb. 1989 , 90-91.

Tan, et al., "U.S. Appl. No. 12/623,767", Infrared Proximity Sensor Package with Improved Crosstalk Isolation, filed Nov. 23, 2009, 30 pages.

Tyntek, "Data Sheet for AIGaAs/GaAs Infrared Chip", TK 114IRA Mar. 2004.

Tyntek, "Si Photo-Diode Chip—TK043PD Data Sheet", Dec. 19, 2007.

Xydar, "G-930—Solvay Advanced Polymers—Liquid Crystal Polymer Data Sheet", reproduced from website at www.ides.com/grades/ds/E22219.htm on Dec. 17, 2007.

* cited by examiner

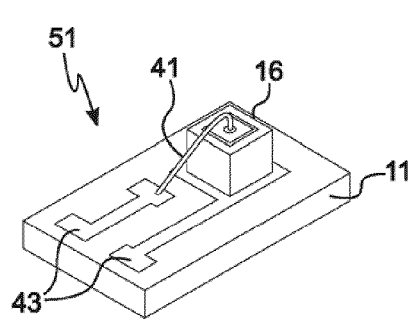
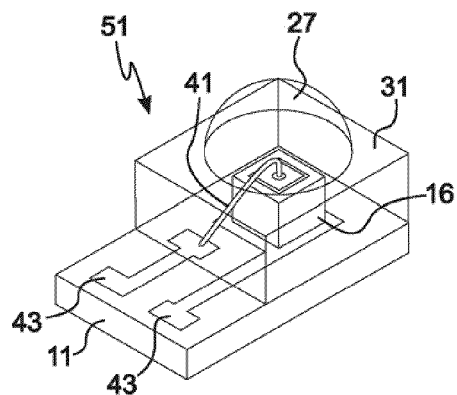
FIG. 7   FIG. 8
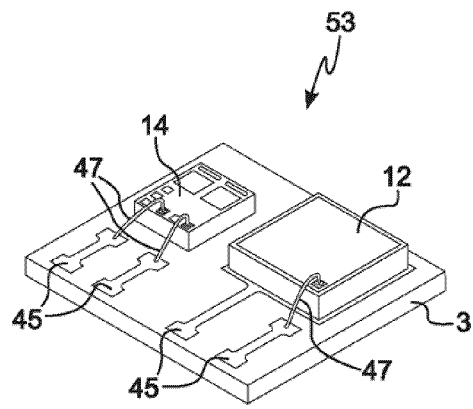
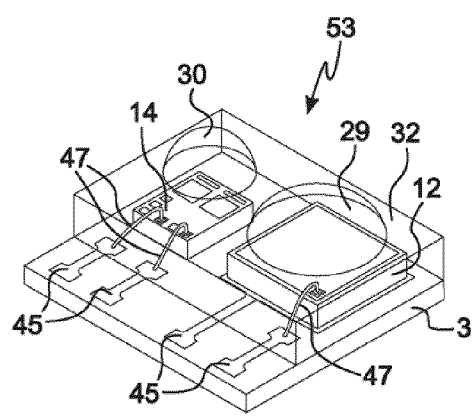
FIG. 9   FIG. 10

PACKAGE-ON-PACKAGE (POP) OPTICAL PROXIMITY SENSOR

FIELD OF THE INVENTION

Various embodiments of the inventions described herein relate to the field of proximity sensors, and components, devices, systems and methods associated therewith.

BACKGROUND

Optical proximity sensors, such as the AVAGO TECHNOLOGIES™ HSDL-9100 surface-mount proximity sensor, the AVAGO TECHNOLOGIES™ APDS-9101 integrated reflective sensor, the AVAGO TECHNOLOGIES™ APDS-9120 integrated optical proximity sensor, and the AVAGO TECHNOLOGIES™ APDS-9800 integrated ambient light and proximity sensor, are known in the art. Such sensors typically comprise an integrated high efficiency infrared emitter or light source and a corresponding photodiode or light detector, and are employed in a large number of handheld electronic devices such as mobile phones, Personal Data Assistants ("PDAs"), laptop and portable computers, portable and handheld devices, amusement and vending machines, industrial automation machinery and equipment, contactless switches, sanitary automation machinery and equipment, and the like.

Referring to FIG. 1, there is shown a prior art optical proximity sensor 10 comprising infrared light emitter 16, light emitter driving circuit 51, light detector or photodiode 12, light detector sensing circuit 53, metal housing or shield 18 with apertures 52 and 54, and object to be sensed 60. Light rays 15 emitted by emitter 16 and reflected as light rays 19 from object 60 (which is in relatively close proximity to optical proximity sensor 10) are detected by photodiode 12 and thereby provide an indication that object 60 is close or near to sensor 10.

As further shown in FIG. 1, optical proximity sensor 10 further comprises metal housing or shield 18 formed of metal and comprising apertures 52 and 54 located over light emitter 16 and light detector 12, respectively, such that at least a first portion of light 15 emitted by light detector 12 passes through aperture 55, and at least a second portion of the first portion 19 of light reflected from object 50 in proximity to sensor 10 passes through aperture 57 for detection by light detector 12. As shown, metal housing or shield 18 may further comprise first and second modules 61 and 63 within which light emitter 16 and light detector 12 are disposed, respectively. The first and second modules 61 and 63 comprise adjoining optically opaque metal inner sidewalls 25 to provide optical isolation between first and second modules 61 and 63.

Many optical proximity sensors generally include a metal shield, such as shield or housing 18 of the type shown in FIG. 1, to provide optical isolation between light emitter 16 and light detector or photodiode 12 so that undesired optical cross-talk between emitter 16 and detector 12 is minimized. See, for example, the Data Sheets corresponding to the AVAGO TECHNOLOGIES™ APDS-9120 Integrated Optical Sensors Preliminary Datasheet and the AVAGO TECHNOLOGIES™ APDS-9800 Integrated Ambient Light and Proximity Sensors Preliminary Datasheet, each of which is hereby incorporated by reference herein, each in its respective entirety.

FIG. 2 shows a prior art optical proximity sensor 10 with metal shield or housing 18. The optical proximity sensor shown in FIG. 2 is an AVAGO TECHNOLOGIES™ APDS-9120 Integrated Optical Proximity Sensor, which contains a molded plastic substrate 11 upon which are mounted LED 16 and light detector or photodiode 12. Single-piece metal shield 18 covers LED 16 and light detector or photodiode 12 and contains a downwardly projecting light barrier 65 disposed therebetween (not shown in FIG. 2). Electrical contacts 17 provide a means to establish electrical connections between proximity sensor 10 and external devices. In the APDS-9120 optical proximity sensor, metal shield 18 is formed and thinned using conventional metal stamping techniques, and is affixed to the underlying plastic substrate 11 by gluing. The APDS-9120 sensor has an areal footprint of only 4 mm by 4 mm, and thus is quite small.

FIG. 3 shows a prior art optical proximity sensor 10 with a more complicated metal shield or housing 18 than that of FIG. 2. The optical proximity sensor shown in FIG. 3 is an AVAGO TECHNOLOGIES™ APDS-9800 Integrated Ambient Light and Proximity Sensor, which contains a printed circuit board ("PCB") substrate 11 upon which are mounted LED 16, light detector or photodiode 12, and ambient light sensor 14. The two-piece metal shield 18 covers LED 16, light detector or photodiode 12, and ambient light sensor 14 and contains a downwardly projecting light barrier 65 disposed therebetween. In the APDS-9800 optical proximity sensor, metal shield 18, being of a considerably more complicated shape and geometry than that of FIG. 2, is formed and thinned using more advanced progressive metal stamping techniques, and must be hand-fitted and attached to the underlying PCB by gluing to ensure proper alignment and fit.

As will now be seen, at least some optical proximity sensors of the prior art rely upon the use of an externally mounted metal shield 18, which is required to reduce the amount of crosstalk or interference that might otherwise occur between LED 16 and light detector 12, as well as to help increase the detection distance of the device. Metal shields 18 are quite small, however, making them difficult to manufacture in high volumes, and thus expensive to fabricate. Such metal shields 18 also generally require expensive automated equipment to attach same to sensors 10 in a mass production setting. Moreover, the quality of metal shields 18 often varies, and issues commonly arise with suppliers being unable to meet the tight dimensional tolerances required for such small devices. Metal shields 18 can also detach from sensor 10, thereby adding another failure point for sensor 10.

In addition, the commercial marketplace demands ever smaller portable electronic devices. This of course means there exists a motivation to make optical proximity sensors ever smaller. As optical proximity sensors become smaller, it becomes increasingly difficult to manufacture and attach the aforementioned metal shields to the sensors in a mass production setting. The metal shields themselves also add to the bulk and volume of the resulting sensor or package.

What is need is an optical proximity sensor design that eliminates the need to include a metal shield 18, but which retains high crosstalk and interference rejection characteristics so that an optical proximity sensor can be provided that features improved performance, lower cost, increased manufacturability and improved reliability. What is also needed is a smaller optical proximity sensor.

SUMMARY

In some embodiments, there is provided an optical proximity sensor comprising an infrared light emitter mounted atop a first substrate, a light detector mounted atop a second substrate, and an integrated circuit mounted atop a third substrate and encapsulated by an overmolding material, the integrated circuit comprising light emitter driving and light detecting circuits, the third substrate further comprising at least first and second sets of wire bond pads electrically connected to the integrated circuit and not covered by the overmolding material wherein the first and second substrates are mounted atop the overmolding compound, the light emitter is electrically connected to the light emitter driving circuit through the first set of wire bond pads, the light detector is electrically connected to the light detecting circuit through the second set of wire bond pads, a first molded infrared light pass component is disposed over and covers the light emitter, a second molded infrared light pass component is disposed over and covers the light detector, and a molded infrared light cut component is disposed between and over portions of the third substrate and the first and second infrared light pass components.

In other embodiments, there is provided a method of making an optical proximity sensor comprising mounting an infrared light emitter atop a first substrate, mounting a light detector atop a second substrate, mounting an integrated circuit atop a third substrate comprising at least first and second sets of wire bond pads electrically connected to the integrated circuit, the integrated circuit comprising light emitter driving and light detecting circuits, at least partially encapsulating the integrated circuit with an overmolding material such that the wire bond pads are covered by the overmolding material, mounting the first and second substrates atop the overmolding compound, electrically connecting the light emitter to the light emitter driving circuit through the first set of wire bond pads, electrically connecting the light detector to the light detecting circuit through the second set of wire bond pads, molding or casting a first infrared light pass component the light emitter, molding or casting a second infrared light pass component over the light detector, and molding or casting an infrared light cut component between and over portions of the third substrate and the first and second infrared light pass components.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

FIG. 7 shows substrate 11 of light emitter package 51 with light emitter 16 mounted thereon;

FIG. 8 shows substrate 11 of light emitter package 51 with light emitter 16 mounted thereon and overmolded with optically transmissive first infrared pass compound 31;

FIG. 9 shows substrate 3 of light detector package 53 with light detectors 12 and 14 mounted thereon;

FIG. 10 shows substrate 3 of light detector package 53 with light detectors 12 and 14 mounted thereon and overmolded with optically transmissive second infrared pass compound 32;

FIG. 16 shows one embodiment of method 200 for making light detector package 53.

The drawings are not necessarily to scale. Like numbers refer to like parts or steps throughout the drawings, unless otherwise noted.

DETAILED DESCRIPTION OF SOME PREFERRED EMBODIMENTS

Figure 1:
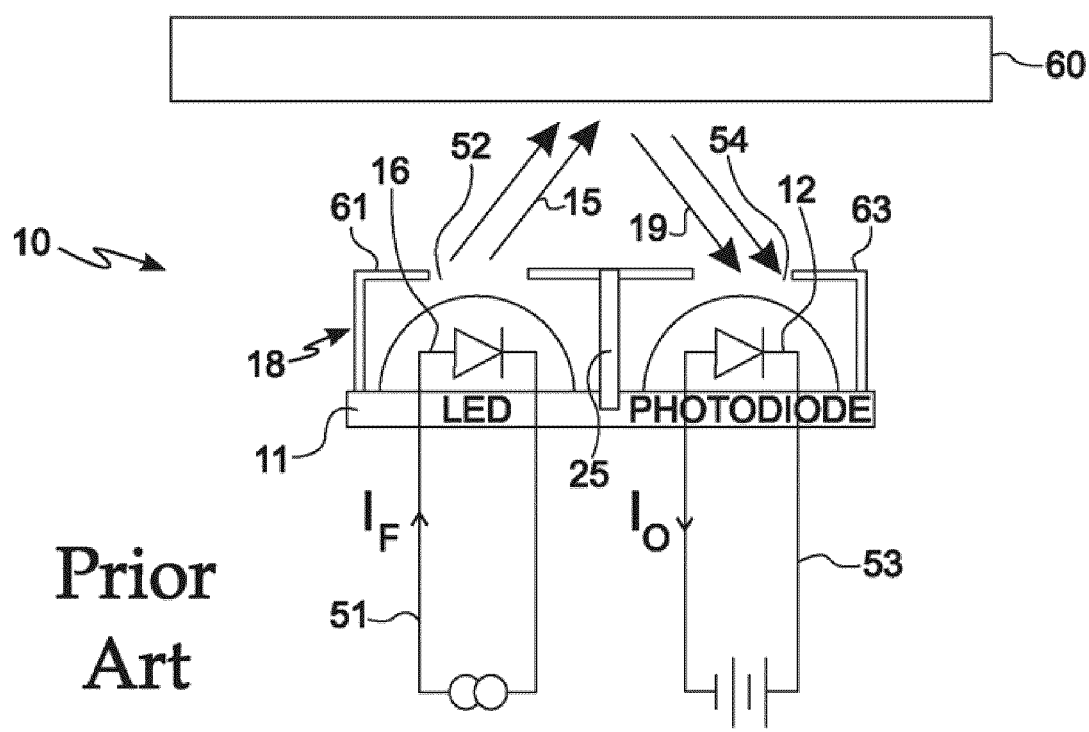
FIG. 1 shows a prior art optical proximity sensor and associated circuitry.
Figure 2:
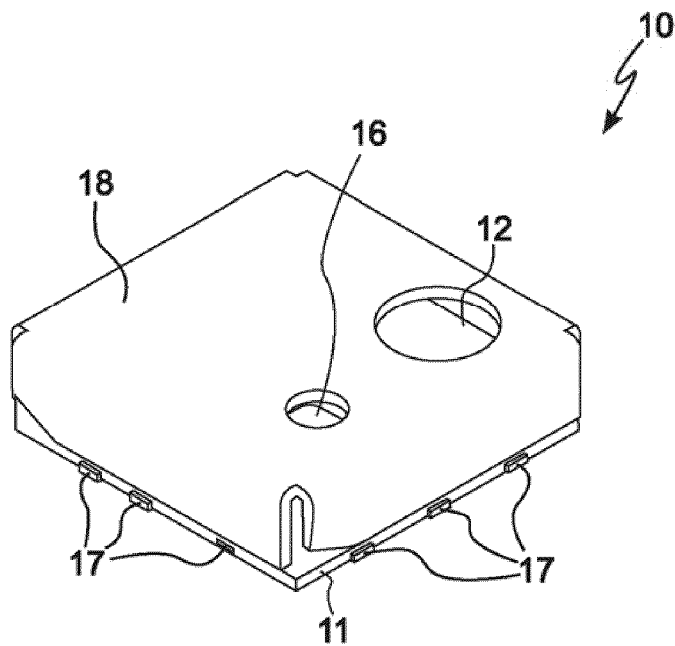
FIG. 2 shows a prior art optical proximity sensor with a metal shield or housing.
Figure 3:
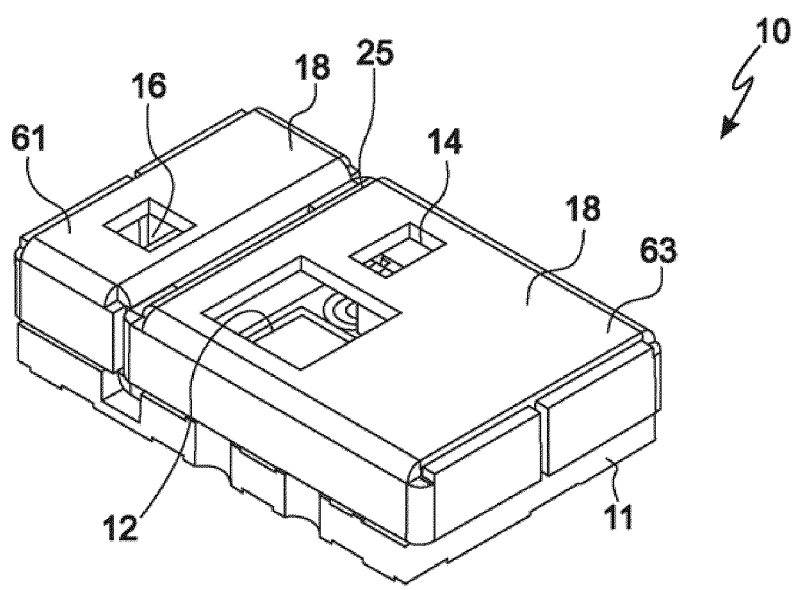
FIG. 3 shows a prior art optical proximity sensor with a more complicated metal shield or housing than that shown in FIG. 2.
Figure 4:
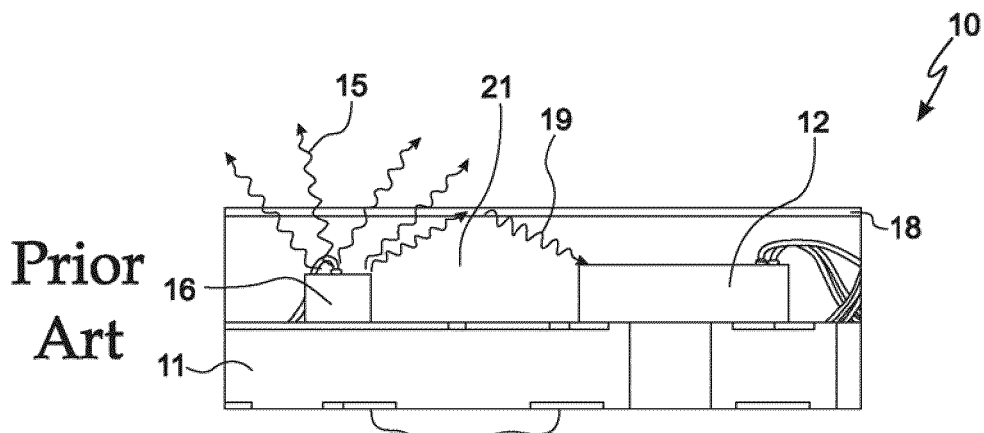
FIG. 4 shows an optical proximity sensor comprising a light emitter mounted on a substrate and separated from a light detector by an optically transmissive material.

Referring now to FIG. 4, there is shown an optical proximity sensor 10 comprising light emitter 16 mounted on substrate 11 and separated from light detector 12 by optically transmissive material 21, which is a single mold two-part epoxy or transfer molding compound. As shown in FIG. 4, while light rays 15 are transmitted through material 21, other reflected, diffracted or refracted IR radiation 19 can leak across to light detector 12 through single mold compound 21, which manifests itself as undesired crosstalk or interference between light emitter 16 and light detector 12, thereby degrading the performance of proximity sensor 10.

Figure 5:
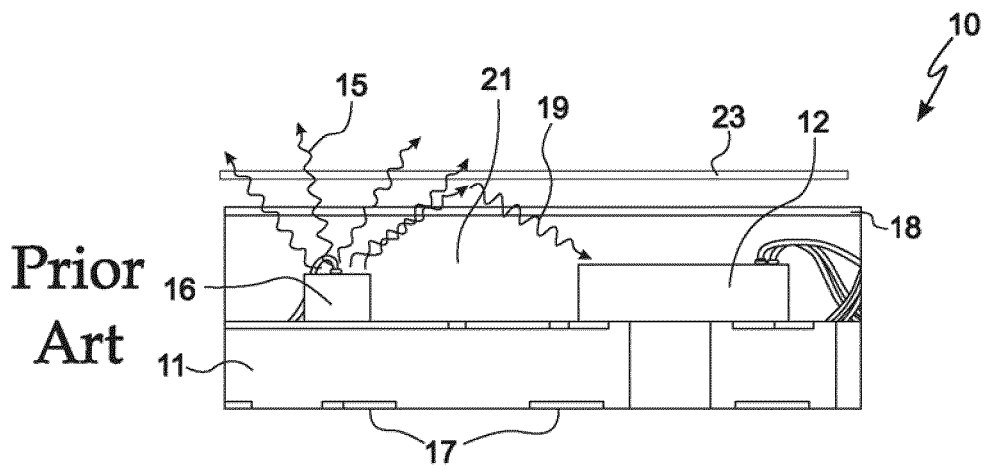
FIG. 5 shows an optical proximity sensor comprising a light emitter mounted on a substrate and separated from a light detector by an optically transmissive material, and a window disposed above the optical proximity sensor.

As further shown in FIG. 5, the amount of reflected, diffracted or refracted IR radiation 19 and undesired crosstalk or interference between light emitter 16 and light detector 12 is typically exacerbated by the presence of window 23, which in some applications is provided as part of the portable or other type of electronic device in which proximity sensor 10 is housed and mounted.

Figure 6:
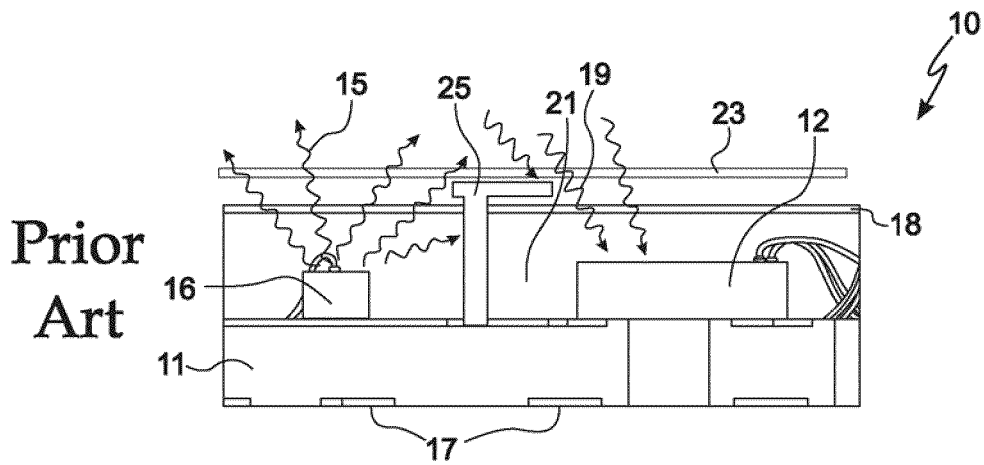
FIG. 6 shows an optical proximity sensor comprising a light emitter mounted on a substrate and separated from a light detector by a metal light barrier.

As shown in FIG. 6, the problems arising from undesired crosstalk or interference caused by reflected, diffracted or refracted IR radiation 19 may be reduced by disposing a metal light barrier 25 between light emitter 16 and light detector 12. Providing such a metal barrier 25 in proximity sensor 10, however, presents problems respecting increased manufacturing costs and complexity.

Figure 13:
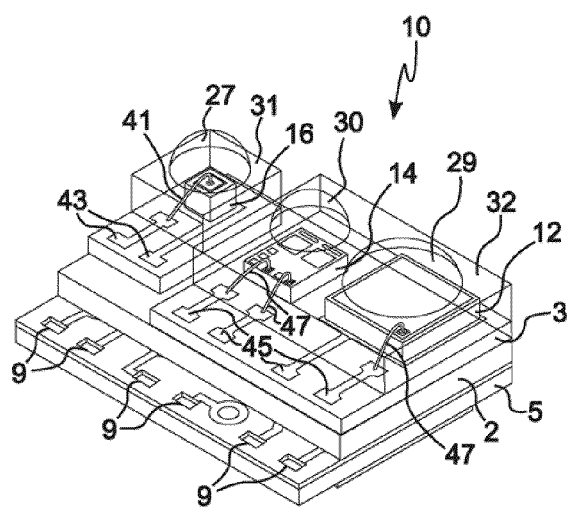
FIG. 13 shows light emitter package 51 and light detector package 53 mounted atop integrated circuit 55 to form optical sensor 10.
Figure 14:
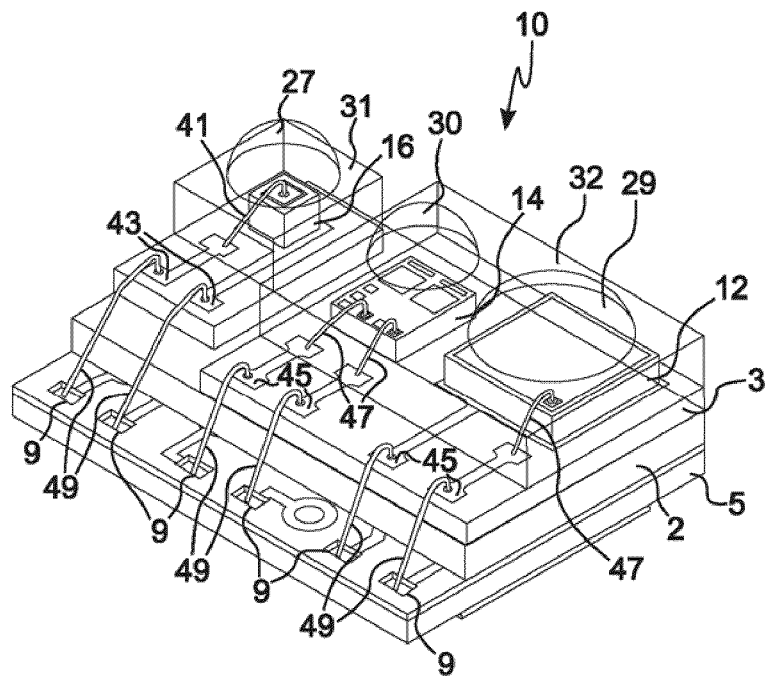
FIG. 14 shows light emitter package 51 and light detector package 53 wire bonded to integrated circuit 55.
Figure 15:
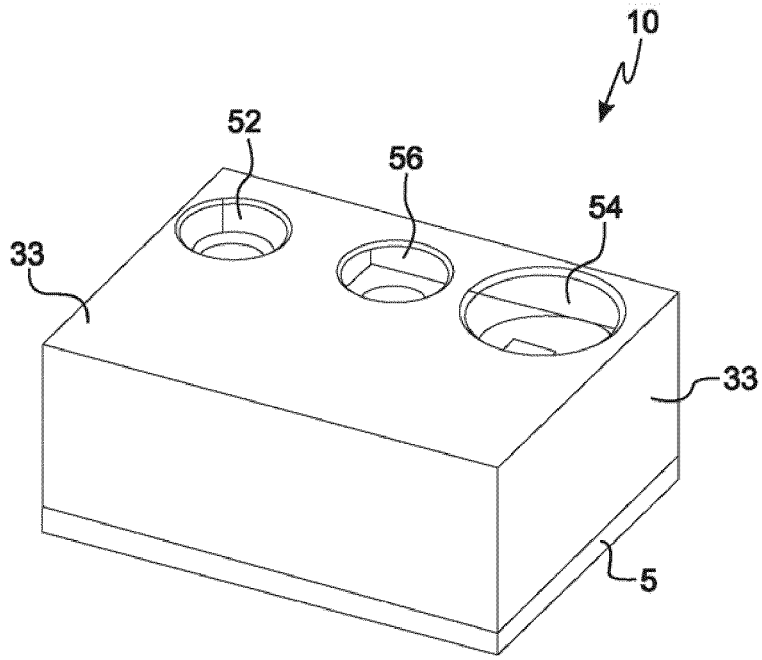
FIG. 15 shows optical sensor 10 of FIG. 14 overmolded with an optically non-transmissive infrared cut compound 33.

Referring now to FIGS. 7 through 15, there are is shown one embodiment of optical proximity sensor 10 and its various components during various stages of assembly. The complete optical proximity sensor of such an embodiment is shown in FIG. 15. As will become apparent, the embodiment of optical proximity sensor 10 shown in FIG. 15 overcomes many of the problems associated with prior art optical proximity sensors by completely eliminating the need for a metal shield, reducing the overall size, volume and footprint of optical proximity sensor 10, and reducing manufacturing and material costs associated therewith. For example, in one embodiment optical sensor 10 shown in of FIG. 15 may be configured to have dimensions of about 4.0 mm×3.0 mm×1.65 mm. Many other advantages of the embodiment of the optical proximity sensor 10 illustrated in FIGS. 7 though 15 will become apparent to those skilled in the art upon having read, understood and considered the present specification and drawings.

Figure 12:
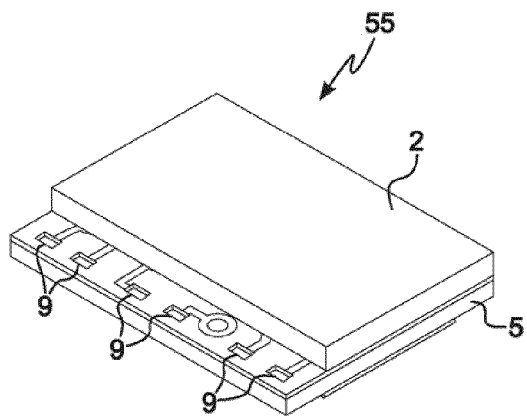
FIG. 12 shows substrate 5 of integrated circuit package 55 with integrated circuit 35 mounted thereon and overmolded with optically non-transmissive infrared cut compound 33.

Note that optical proximity sensor 10 shown in FIG. 15 is a package-on-package optical sensor comprising three distinct different packages, which are combined to form the optical proximity sensor 10 illustrated in FIG. 15. The first package is light emitter package 51 illustrate din FIGS. 7 and 8. The second package is light detector package 53 illustrated in FIGS. 9 and 10. The third package is integrated circuit package 55 illustrated in FIGS. 11 and 12. FIGS. 13, 14 and 15 illustrate packages 51, 53 and 55 combined together during various stages of one embodiment of a manufacturing process.

Referring now to FIG. 7, there is shown first light emitter package 51 comprising first substrate 11 having mounted thereon light emitter 16, which is operably connected to one of wire bond pads 43 via wire 41. According to one embodiment, light emitter 16 is a semiconductor infrared LED such as a Model No. TK116IRA TYNTEK™ AlGaAs/GaAs Infrared Chip, the data sheet for which is included in an Information Disclosure Statement filed on even date herewith and the entirety of which is hereby incorporated by reference herein. In one embodiment, first substrate 11 is a printed circuit board having traces, wire bond pads and/or vias disposed thereon or therein. Conventional materials well known to those skilled in the art may be employed to form first substrate 11. FIG. 8 shows first light emitter package 51 after first molded optically transmissive infrared light pass component 31 has been disposed over and covers light emitter 16. Note that first molded optically transmissive infrared light pass component 31 may be shaped to include lens 27, as shown in FIG. 8, lens 28 being configured to collimate and direct light emitted by light emitter 16 outwardly away from first package 51 towards object to be detected 60 (not shown in FIG. 8).

Referring now to FIG. 9, there is shown second light detector package 53 comprising second substrate 3 having mounted thereon light detector 12 and ambient light detector 14, which are operably connected to wire bond pads 45 via wires 47. According to one embodiment, light detector 12 is an ASIC such as an AVAGO TECHNOLOGIES™ APDS-9120 integrated optical proximity sensor and ambient light detector 14 is AVAGO TECHNOLOGIES™ APDS-9800 integrated ambient light and proximity sensor. In one embodiment, second substrate 3 is a printed circuit board having traces, wire bond pads and/or vias disposed thereon or therein. Conventional materials well known to those skilled in the art may be employed to form second substrate 3. FIG. 10 shows second light detector package 53 after second molded optically transmissive infrared light pass component 32 has been disposed over and covers light detector 12 and ambient light detector 14. Note that second molded optically transmissive infrared light pass component 32 may be shaped to include lenses 29 and 30 as shown in FIG. 10, where lenses 29 and 30 are configured to collimate and direct light reflected from object to be detected 60 (not shown in FIG. 10) inwardly towards light detector 12 and ambient light detector 14. Optical lenses 27, 29 and 30 of FIGS. 8 and 10 are preferably formed of the same material, and formed at the same time during the manufacturing process, as first and second molded optically transmissive infrared light pass components 31 and 32, and are operably disposed over light emitter 16, light detector 12 and ambient light detector 14, respectively, as shown in FIGS. 8 and 10.

Figure 11:
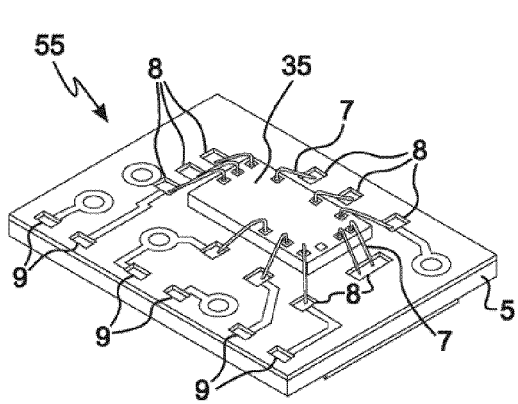
FIG. 11 shows substrate 5 of integrated circuit package 55 with integrated circuit 35 mounted thereon.

Referring now to FIG. 11, there is shown third integrated circuit package 55 comprising third substrate 5 having mounted thereon integrated circuit 35, which is operably connected to wire bond pads 8 via wires 7. According to one embodiment, integrated circuit 35 is an AVAGO TECHNOLOGIES™ APDS-9700 signal conditioning IC for optical proximity sensors, the data sheet for which is hereby incorporated by reference herein in its entirety. In one embodiment, third substrate 5 is a printed circuit board having traces, wire bond pads and/or vias disposed thereon or therein. Conventional materials well known to those skilled in the art may be employed to form third substrate 5. FIG. 12 shows third integrated circuit package 55 after overmolding material 2 has partially encapsulated integrated circuit 35 such that wire bond pads 9 are not covered by overmolding material 2. Overmolding material 2 seals and protects integrated circuit 35 therewithin, and also provides a platform for first and second packages 51 and 53 to mounted thereabove, more about which is said below. Note that by placing integrated circuit package 55 beneath first and second packages 51 and 53, substantial volume and space reductions are achieved. This is because since integrated circuit 35 is vertically stacked with respect to first and second packages 51 and 53 instead of being spread out on a single substrate or printed circuit as in the prior art.

Referring now to FIG. 13, there is shown optical sensor 10 with all three packages 51, 53 and 55 combined into a single package 10. As shown in FIG. 13, first light emitter package 51 is mounted atop overmolding material 2 of underlying integrated circuit package 55, preferably by being epoxied or glued thereto. Similarly, second light detector package 53 is also mounted atop overmolding material 2 of underlying integrated circuit package 55, preferably by being epoxied or glued thereto. Note that wire bond pads 9 of integrated circuit package 55 are not covered by overmolding material 2. Note further that first light emitter package 51 and second light detector package 53 are mounted atop overmolding material 2 and third integrated circuit package 55 and spaced apart from one another such that light emitted upwardly by light emitter package 51 and incident on object to be detected 60 (not shown in FIG. 13) is reflected downwardly for reception and detection by light detector 14. FIG. 14 shows optical sensor 10 after wires 49 have been wirebonded between first and second packages 51 and 53 and third package 55 thereby to establish electrical connections between wire bond pads 9 on third package 55 and wire bond pads 43 and 45 on first and second packages 51 and 53.

FIG. 15 shows optical sensor 10 after infrared light cut component 33 has been molded over first package 51, second package 53 and the upper portions of third package 55. Note that infrared light cut component 33 does not extend over apertures 52, 54 and 56, which are configured to permit the passage of direct, reflected and ambient light therethrough, respectively. Infrared light cut component 33 does extend and is molded between first package 51 and second package 53 so as to attenuate or absorb undesired scattered, reflected or direct light rays that might otherwise propagate between light emitter 16 and light detectors 12 and 14. That is, infrared light cut component 33 is configured and molded to substantially attenuate or block the transmission of undesired direct, scattered or reflected light between light emitter 16 and light detector 12, and thereby minimize optical crosstalk and interference between light emitter 16 and light detector 12. Infrared light emitter 16 is operably connected via wires 41 and 43 to integrated circuit 35 and is driven by a light emitter driving circuit contained therein. Similarly, light detector 12 is operably connected via wires 47 and 49 to integrated circuit 35, which comprises a light detector circuit incorporated therein. Ambient light detector or sensor 14 is operably connected via wires 47 and 45 to integrated circuit 35, which contains an ambient light sensing circuit incorporated therein. Located in-between light emitter 16 and first molded optically transmissive infrared light pass component 31, and light detector 12 and second molded optically transmissive infrared light pass component 32, is substantially optically non-transmissive infrared light barrier component 33. At least a first portion of light 15 emitted by light detector 16 passes through first component 31, and at least a second portion 19 of the first portion of light 15 reflected from an object of interest in proximity to proximity sensor 10 passes through second component 32 for detection by light detector 12. Infrared light barrier component 33 substantially attenuates or blocks the transmission of undesired direct, scattered or reflected light between light emitter 16 and light detector 12, and thereby minimizes optical crosstalk and interference between light emitter 16 and light detector 12.

Infra-red rays emitted by light emitter or LED 16 exit sensor 10 and return to light detector 12 as rays, thereby permitting detection of the nearby object that is to be detected. Light rays reflected from the surface of molded component 31 are blocked from reaching light detector 12 by molded substantially optically non-transmissive infrared light cut component 33. Light rays reflected from a window interposed between optical sensor 10 and object to be detected 60 are also blocked by molded substantially optically non-transmissive infrared light cut component 33. Total Internal Reflection between components 31, 32 and 33 helps improve the performance of proximity sensor 10. As will now be seen, the embodiment of sensor 10 shown in FIGS. 7 through 15 eliminates the need to provide a metal shield, while improving the optical performance of sensor 10 by reducing crosstalk and interference, as undesired reflected, refracted or diffracted light rays cannot penetrate and travel through to light detectors 12 or 14.

According to one embodiment, first and second molded optically transmissive infrared light pass components 31 and 32 are formed using an infrared-pass and optically transmissive transfer molding compound such as NITTO DENKO™ NT-8506 clear transfer molding compound 8506 or PENCHEM Technologies™ OP 579 infrared pass optoelectronic epoxy. Other suitable optically transmissive epoxies, plastics, polymers or other materials may also be employed. In some embodiments, and as discussed in further detail below, optically transmissive infrared light pass components 31 and 32 are molded during the same manufacturing step, or may be molded separately. See Technical Data Sheet NT-8506 entitled "Clear Transfer Molding Compound NT-8506" dated 2001 and PENCHEM OP 579 IR Pass Optoelectronic Epoxy Data Sheet, Revision 1, dated April, 2009, both of which documents are hereby incorporated by reference herein, each in its respective entirety.

In one embodiment, molded substantially optically non-transmissive infrared light cut component 33 is formed using an infrared-blocking, filtering or cutting transfer molding compound such as NITTO DENKO™ NT-MB-IRL3801 two-part epoxy resin material or PENCHEM Technologies™ OP 580 infrared filter optoelectronic epoxy, either of which preferably contains an amount of an infrared cutting material that has been selected by the user to achieve acceptable infrared light blocking performance while minimizing the amount of such infrared cutting material employed to keep costs to a minimum. Other suitable optically non-transmissive epoxies, plastics, polymers or other materials may also be employed. See Technical Data Sheet NT-MB-IRL3801 published by DENKO™ dated 2008 and PENCHEM OP 580 IR Filter Optoelectronic Epoxy Data Sheet, Revision 1, dated April, 2009, both of which documents are hereby incorporated by reference herein, each in its respective entirety.

FIG. 15 illustrates one embodiment of method 100 for making light emitter package 51. Method 100 starts by providing LED or first substrates 11 and LEDs or light emitters 16. LED semiconductor wafers containing light emitter dice 16 are preferably mounted on blue tape, backgrinded and diced. Then individual dice 16 are attached to substrates 11 in step 105 using an electrically conductive epoxy such as FDP5053 or FDP5100. The epoxy is cured in step 107. After die attachment, plasma cleaning is conducted at step 109 to clean the surfaces of substrates 11, and especially the wire bonding surfaces thereof, before wire bonding is conducted at step 111. After wire bonding, 100% visual inspection is conducted at step 113 to verify bond quality and integrity. After visual inspection, a second plasma cleaning step 115 is conducted. Next, a transfer molding process is conducted at step 117 using NT8506 clear or infrared pass compound, followed at step 119 by post-mold curing. After curing, substrates 11 are diced at step 121 to form individual packages 51, which are then and baked at step 123. Electrical open and short testing is then conducted on individual packages 51 at step 125. After testing, individual packages 51 that have passed tests performed at step 125 are prepared for subsequent manufacturing processes.

Figure 16:
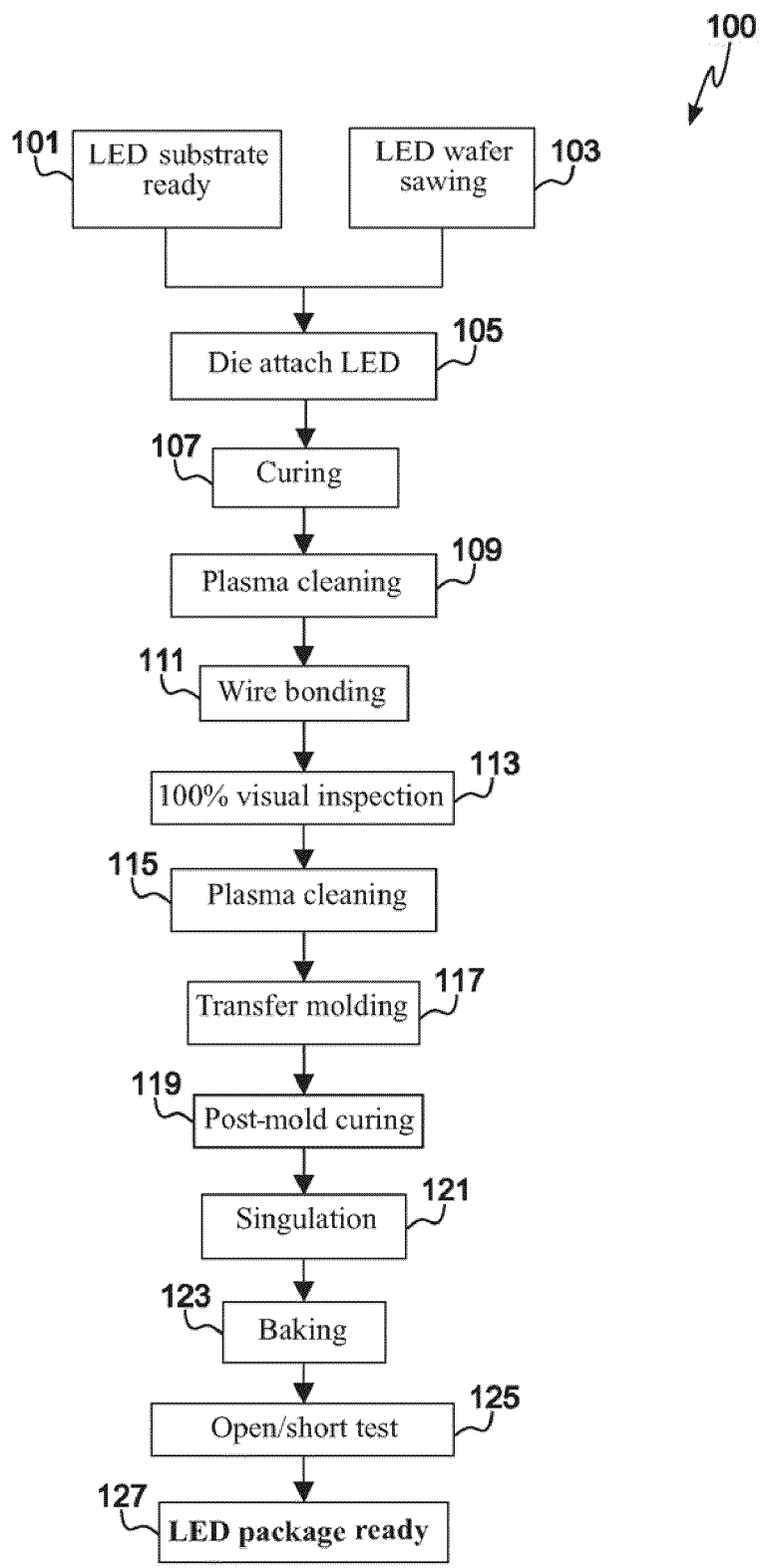
FIG. 16 shows one embodiment of method 100 for making light emitter package 51.

FIG. 16 illustrates one embodiment of method 200 for making light detector package 53. Method 200 starts by providing light detector or second substrates 3 and light detectors 12 and 14. Light detector semiconductor wafers containing light detector dice 12 or 14 are preferably mounted on blue tape, backgrinded and diced. Then individual dice 14 (such as AVAGO TECHNOLOGIES PD TK043 ASICs) are attached to substrates 3 in step 209 using an electrically conductive epoxy such as FDP5053 or FDP5100, and individual dice 12 such as AVAGO TECHNOLOGIES Ambient Light Sensor ("ALS") ASICs are attached to substrates 3 in step 205 using an electrically non-conductive epoxy such as ABLESTIK™ 2025. The epoxies are cured in steps 207 and 211. After die attachment, plasma cleaning is conducted step 213 to clean the surfaces of substrates 3, and especially the wire bonding surfaces thereof, before wire bonding is conducted at step 215. After wire bonding, 100% visual inspection is conducted at step 217 to verify bond quality and integrity. After visual inspection, a second plasma cleaning step 219 is conducted. Next, a transfer molding process is conducted at step 221 using NT8506 clear or infrared pass compound, followed at step 223 by post-mold curing. After curing, substrates 3 are diced at step 225 to form individual packages 53, which are then baked at step 227. Electrical open and short testing is then conducted on individual packages 53 at step 229. After testing, individual packages 53 that have passed tests performed at step 229 are prepared for subsequent manufacturing processes.

Figure 17:
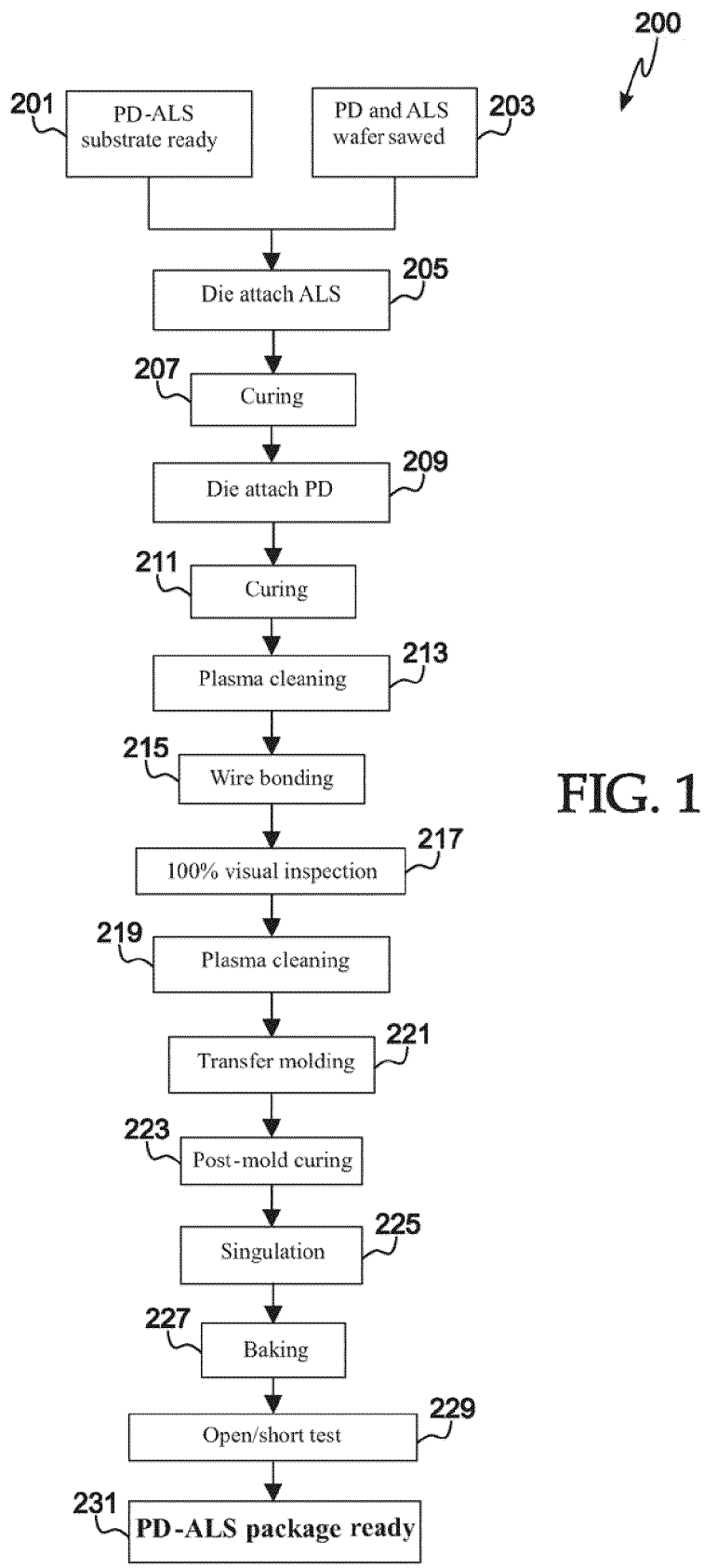
FIG. 17 shows one embodiment of method 300 for making proximity sensor 10 using light emitter package 51, light detector package 53, and integrated circuit package 55.
Figure 18:
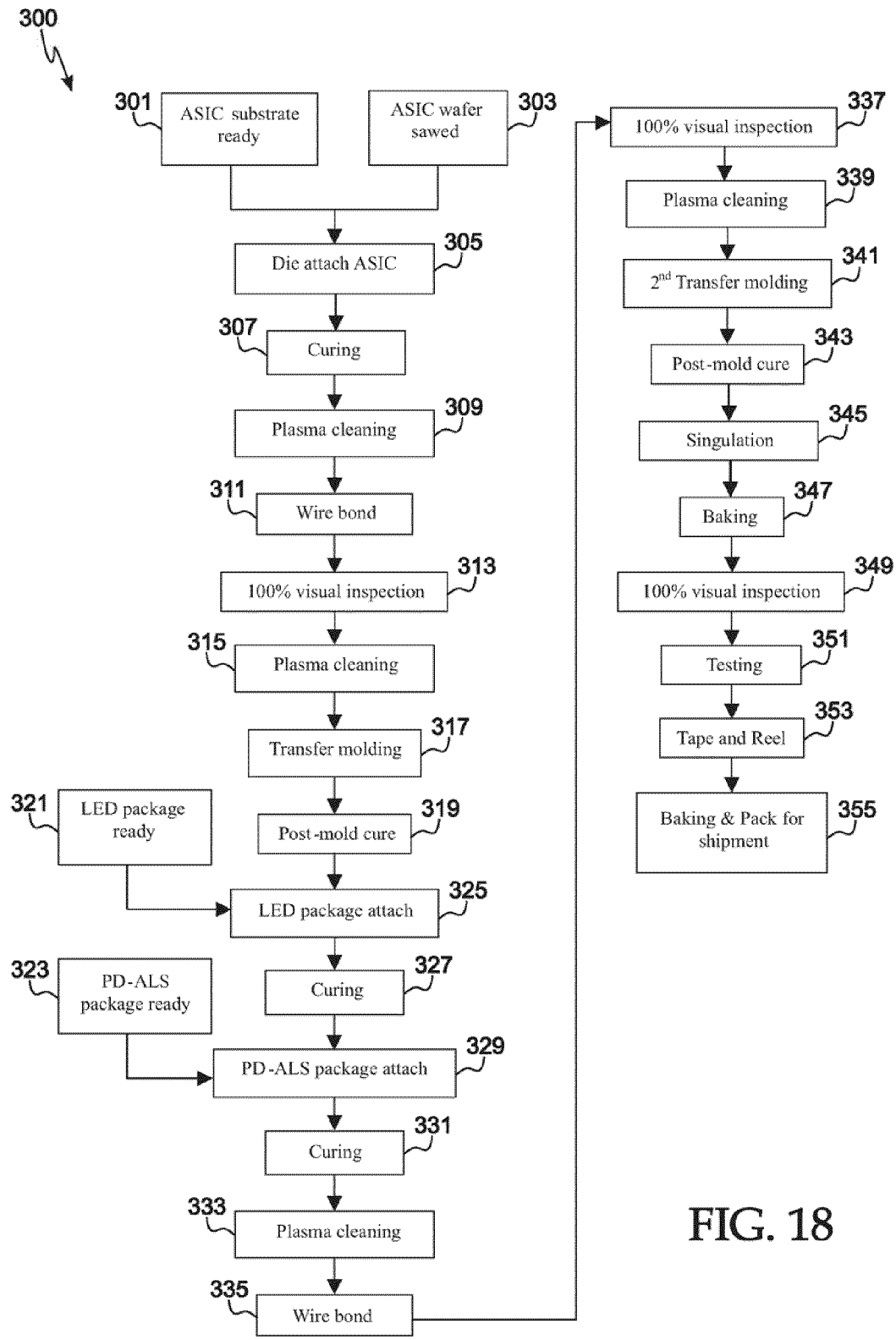

FIG. 17 illustrates one embodiment of method 300 for making integrated circuit package 55 and then combining light emitter package 51 and light detector package 53 therewith to form complete package-on-package optical sensor 10. Method 300 starts by providing integrated circuit or third substrate 5 and integrated circuit or ASIC 35. ASIC semiconductor wafers containing integrated circuit or ASIC dice 35 are preferably mounted on blue tape, backgrinded and diced. In one embodiment, AVAGO TECHNOLOGIES™ 9700

ASICs are employed for integrated circuit or ASIC 35. Individual dice 35 are first attached to substrates 5 in step 305 using an electrically non-conductive epoxy such ABLESTIK™ 2025 which is then cured at step 307. After die attachment, plasma cleaning is conducted at step 309 to clean the surfaces of substrates 5, and especially the wire bonding surfaces thereof, before wire bonding is conducted at step 311. After wire bonding, 100% visual inspection is conducted at step 313 to verify bond quality and integrity. After visual inspection, a second plasma cleaning step 315 is conducted. Next, a transfer molding and encapsulation process is conducted at step 317 using NT8570 black IR cut compound, followed at step 319 by post-mold curing. Next, light emitter package 51 is attached to the overmolded top surface of integrated circuit package 55 at step 325, and light detector package 53 is attached to the overmolded top surface of integrated circuit package 55 at step 327. In steps 325 and 327 an electrically non-conductive epoxy such ABLESTIK™ 2025 is employed. After package attachment, plasma cleaning is conducted step 333 to clean the surfaces of packages 51, 53 and 55, and especially the wire bonding surfaces thereof, before wire bonding is conducted at step 335. After wire bonding, 100% visual inspection is conducted at step 337 to verify bond quality and integrity. After visual inspection, plasma cleaning is conducted at step 339 is conducted. Next, a transfer molding process is conducted at step 341 using NT8570 black IR cut compound, followed at step 343 by post-mold curing. After curing, optical sensors 10 are diced at step 345 to form individual sensors 10, which are then baked at step 347. Electrical open and short testing is then conducted on individual sensors 10 at step 351. After testing, sensors 10 that have passed the electrical tests of step 351 are taped, baked and packed for shipment.

The transfer molding processes described above include methods where thermosetting materials are softened by heat and pressure in a transfer chamber, and then forced at high pressure through suitable sprues, runners, and gates into a closed mold for final curing.

Included within the scope of the present invention are methods of making and having made the various components, devices and systems described herein.

Those skilled in the art will understand that the various embodiments of the proximity sensor disclosed herein may be incorporated into portable electronic devices such as mobile telephones, smart phones, personal data assistants (PDAs), laptop computers, notebook computer, computers and other devices.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. An optical proximity sensor, comprising:
    an infrared light emitter mounted atop a first substrate;
    a light detector mounted atop a second substrate, and
    an integrated circuit mounted atop a third substrate and encapsulated by an overmolding material, the integrated circuit comprising light emitter driving and light detecting circuits, the third substrate further comprising at least first and second sets of wire bond pads electrically connected to the integrated circuit and not covered by the overmolding material;
    wherein the first and second substrates are mounted atop the overmolding compound, the light emitter is electrically connected to the light emitter driving circuit through the first set of wire bond pads, the light detector is electrically connected to the light detecting circuit through the second set of wire bond pads, a first molded infrared light pass component is disposed over and covers the light emitter, a second molded infrared light pass component is disposed over and covers the light detector, and a molded infrared light cut component is disposed between and over portions of the third substrate and the first and second infrared light pass components.

2. The optical proximity sensor of claim 1, wherein at least a first portion of light emitted by the light emitter passes through the first component, and at least a second portion of the first portion of light reflected from an object of interest in proximity to the sensor passes through the second component for detection by the light detector, and the infrared light cut component substantially attenuates or blocks the transmission of undesired direct, scattered or reflected light between the light emitter and the light detector and thereby minimizes optical crosstalk and interference between the light emitter and the light detector.

3. The optical proximity sensor of claim 1, wherein at least one of the first and second infrared light pass components comprises an optically transmissive epoxy, polymer or plastic.

4. The optical proximity sensor of claim 1, wherein the infrared light cut component comprises a substantially optically non-transmissive moldable material, epoxy, polymer or plastic.

5. The optical proximity sensor of claim 1, wherein the infrared light cut component further comprises an infrared cut or blocking additive.

6. The optical proximity sensor of claim 1, wherein at least one of the first, second and third substrates is a printed circuit board ("PCB").

7. The optical proximity sensor of claim 1, wherein at least one of the light emitter and the light detector is a semiconductor die.

8. The optical proximity sensor of claim 1, wherein the integrated circuit is an application specific integrated circuit ("ASIC").

9. The optical proximity sensor of claim 1, further comprising an ambient light sensor.

10. The optical proximity sensor of claim 9, further wherein the ambient light sensor is mounted atop the second substrate.

11. The optical proximity sensor of claim 1, wherein the optical proximity sensor is incorporated into a portable electronic device.

12. The optical proximity sensor of claim 11, wherein the portable electronic device is a mobile telephone, a personal data assistant (PDA), a laptop computer, a notebook computer, or a computer.

13. The optical proximity sensor of claim 1, wherein the light emitter is an LED.

14. The optical proximity sensor of claim 1, wherein the light detector is a positive-intrinsic-negative ("PIN") diode.

15. The optical proximity sensor of claim 1, wherein a molded optically transmissive lens is formed over at least one of the light emitter or the light detector.

16. A method of making an optical proximity sensor, comprising:

mounting an infrared light emitter atop a first substrate;
mounting a light detector atop a second substrate;
mounting an integrated circuit atop a third substrate comprising at least first and second sets of wire bond pads electrically connected to the integrated circuit, the integrated circuit comprising light emitter driving and light detecting circuits;
at least partially encapsulating the integrated circuit with an overmolding material such that the wire bond pads are covered by the overmolding material;
mounting the first and second substrates atop the overmolding compound;
electrically connecting the light emitter to the light emitter driving circuit through the first set of wire bond pads;
electrically connecting the light detector to the light detecting circuit through the second set of wire bond pads;
molding or casting a first infrared light pass component the light emitter;
molding or casting a second infrared light pass component over the light detector, and
molding or casting an infrared light cut component between and over portions of the third substrate and the first and second infrared light pass components.

17. The method of claim 16, further comprising configuring light detector and the light emitter with respect to one another such that at least a first portion of light emitted by the light emitter passes through the first component and at least a second portion of the first portion of light reflected from an object of interest in proximity to the sensor passes through the second component for detection by the light detector.

18. The method of claim 16, further comprising configuring the infrared light cut component to substantially attenuate or block the transmission of undesired direct, scattered or reflected light between the light emitter and the light detector and thereby minimizes optical crosstalk and interference between the light emitter and the light detector.

19. The method of claim 16, wherein optically transmissive lenses are formed over the light emitter and the light detector when the first and second optically transmissive infrared light pass components are molded or casted.

20. The method of claim 16, wherein the light emitter or the light detector is die-attached to the first or second substrate, respectively.

21. The method of claim 16, wherein the light emitter or the light detector is wire-bonded to the first or second substrate, respectively.

22. The method of claim 16, wherein the first and second optically transmissive infrared light pass components are transfer-molded.

* * * * *